(12) United States Patent
Fertig et al.

(10) Patent No.: US 10,375,855 B2
(45) Date of Patent: Aug. 6, 2019

(54) SYSTEMS AND METHODS FOR ZERO POWER AUTOMATIC THERMAL REGULATION

(71) Applicant: Honeywell International Inc., Morris Plains, NJ (US)

(72) Inventors: Chad Fertig, Bloomington, MN (US); Karl D. Nelson, Plymouth, MN (US); Joshua Dorr, Golden Valley, MN (US); Steven Tin, Plymouth, MN (US); Neil A Krueger, Saint Paul, MN (US)

(73) Assignee: Honeywell International Inc., Morris Plains, NJ (US)

( * ) Notice: Subject to any disclaimer, the term of this patent is extended or adjusted under 35 U.S.C. 154(b) by 24 days.

(21) Appl. No.: 15/877,786

(22) Filed: Jan. 23, 2018

(65) Prior Publication Data

US 2019/0141853 A1 May 9, 2019

Related U.S. Application Data

(60) Provisional application No. 62/583,222, filed on Nov. 8, 2017.

(51) Int. Cl.
*F28F 13/00* (2006.01)
*H01L 23/373* (2006.01)
*H05K 7/20* (2006.01)

(52) U.S. Cl.
CPC ....... *H05K 7/20281* (2013.01); *H01L 23/373* (2013.01); *H05K 7/20218* (2013.01); *H05K 7/20263* (2013.01); *H05K 7/20272* (2013.01); *F28F 2013/008* (2013.01)

(58) Field of Classification Search
CPC ....... G06F 1/181–182; H05K 7/20218–20381; H05K 7/20409–20418; H05K 7/20009–202; H05K 7/2039; H01L 23/46–3677; H01L 23/3736
See application file for complete search history.

(56) References Cited

U.S. PATENT DOCUMENTS

| 5,360,056 A | 11/1994 | Forsberg |
| 6,351,478 B1 | 2/2002 | Heberle |
| 6,665,186 B1 | 12/2003 | Calmidi et al. |
| 7,551,656 B2 | 6/2009 | Bennett et al. |
| 2018/0209750 A1* | 7/2018 | Im ..................... F28F 27/00 |

* cited by examiner

*Primary Examiner* — Robert J Hoffberg
*Assistant Examiner* — Razmeen Gafur
(74) *Attorney, Agent, or Firm* — Fogg & Powers LLC

(57) ABSTRACT

Systems and methods for zero power automatic thermal regulation are provided. In one embodiment, a method for passive thermal management comprises: establishing thermal conductivity between a self-heating electronic device and a cooling fluid held within a fluid reservoir via a thermal interface; using thermally controlled expansion of the cooling fluid, controlling a length of a column of the cooling fluid extending into at least one channel extending from the fluid reservoir, wherein the channel provides a non-recirculating path for the cooling fluid to expand into, and wherein the length of a column of the cooling fluid is thermally controlled using heat absorbed by the cooling fluid from the self-heating electronic device; and selectively establishing a primary heat path between the electronic device and a heat sink interface thermally coupled to an external environment as a function of the length of the column of the cooling fluid within the channel.

18 Claims, 7 Drawing Sheets

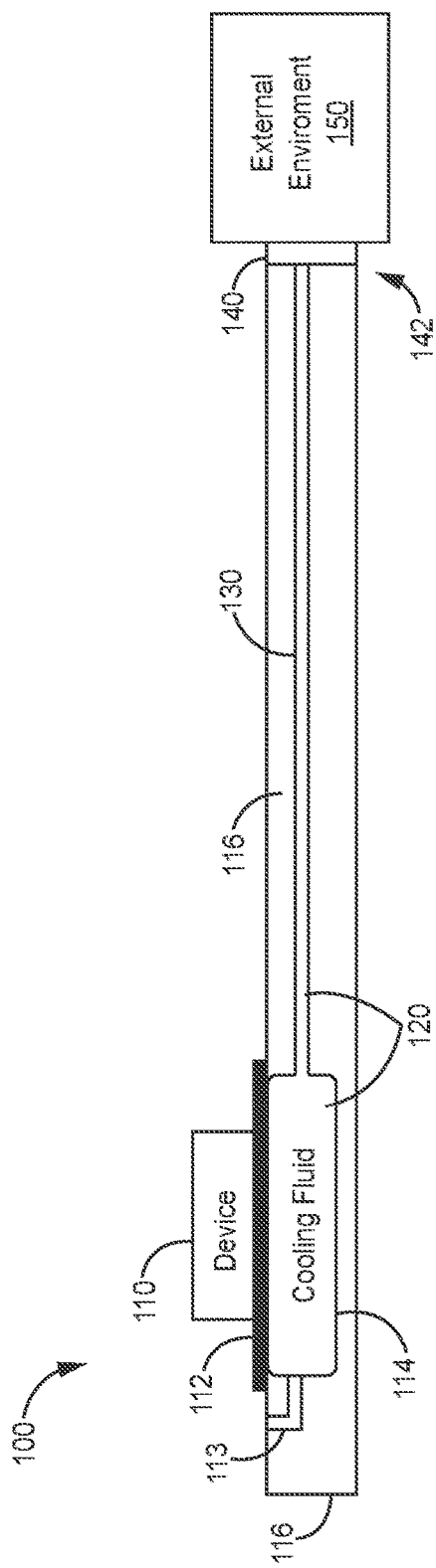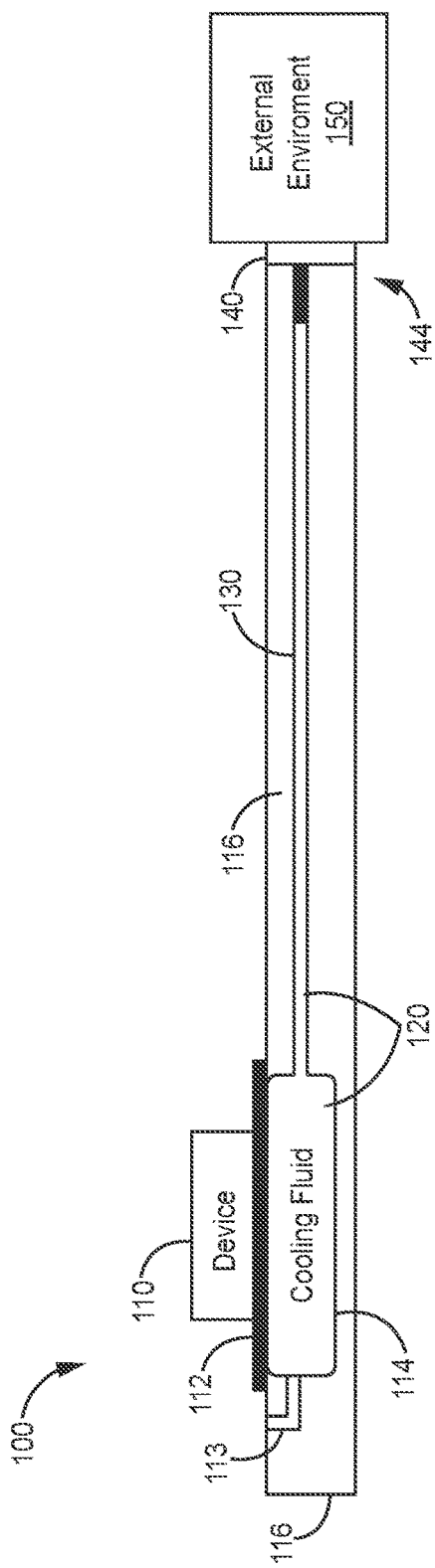
FIG. 1
FIG. 1A

SYSTEMS AND METHODS FOR ZERO POWER AUTOMATIC THERMAL REGULATION

CROSS-REFERENCE TO RELATED APPLICATIONS

This Application is a U.S. Patent Application claiming the benefit of, and priority to, U.S. Provisional Patent Application No. 62/583,222, titled "SYSTEMS AND METHODS FOR ZERO POWER AUTOMATIC THERMAL REGULATION", filed on Nov. 8, 2017 and which is incorporated herein by reference in its entirety.

U.S. GOVERNMENT LICENSE RIGHTS

This invention was made with U.S. Government support under Government Contract Number HR0011-16-C-0122 awarded by DARPA CMO. The U.S. Government has certain rights in the invention.

BACKGROUND

Many micro electro-mechanical system (MEMS) devices need to operate a constant temperature in order to operate correctly. At the same time, MEMS devices are often deployed in systems that experience very dynamic ambient temperature conditions. For example, a MEMS device may need to maintain a constant operating temperature even though the environment in which it is operating may vary between −40 deg. C. to +80 deg. C. Normally, to regulate the temperature of such a device when its environmental temperature is varying, active heating and cooling components may be thermally coupled to the device and cycled to achieve and maintain the desired device temperature. For example, thermal stabilization of MEMS components, crystal oscillators, laser sources, or chemical compounds for atomic vapor stabilization, over wide operating temperature ranges, are usually based on active heating/cooling feedback, which costs power. However, in low power applications, there may not be sufficient excess power resources available to operate active temperature management components.

For the reasons stated above and for other reasons stated below which will become apparent to those skilled in the art upon reading and understanding the specification, there is a need in the art for systems and methods for zero power automatic thermal regulation.

SUMMARY

In one embodiment, a method for passive thermal management comprises: establishing thermal conductivity between a self-heating electronic device and a cooling fluid held within a fluid reservoir via a thermal interface; using thermally controlled expansion of the cooling fluid, controlling a length of a column of the cooling fluid extending from the fluid reservoir into at least one channel extending from the fluid reservoir, wherein the at least one channel provides a non-recirculating path for the cooling fluid to expand into, and wherein the length of a column of the cooling fluid is thermally controlled using heat absorbed by the cooling fluid from the self-heating electronic device; and selectively establishing a primary heat path between the electronic device and a heat sink interface thermally coupled to an external environment as a function of the length of the column of the cooling fluid within the at least one channel.

DRAWINGS

Embodiments of the present disclosure can be more easily understood and further advantages and uses thereof more readily apparent, when considered in view of the description of the preferred embodiments and the following figures in which:

FIGS. 1, 1A illustrate an example passive thermal management system of one embodiment of the present disclosure;

In accordance with common practice, the various described features are not drawn to scale but are drawn to emphasize features relevant to the present disclosure. Reference characters denote like elements throughout figures and text.

DETAILED DESCRIPTION

Figure 1B:
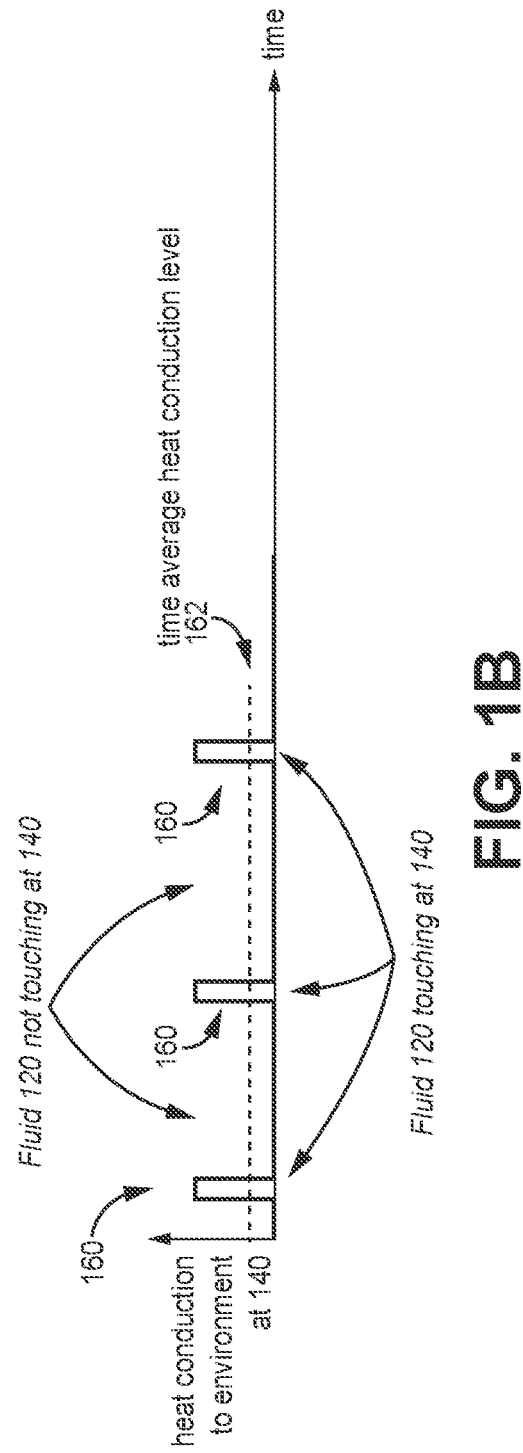
FIG. 1B illustrates an example of time averaged passive thermal management with the system of FIG. 1.

In the following detailed description, reference is made to the accompanying drawings that form a part hereof, and in which is shown by way of specific illustrative embodiments in which the embodiments may be practiced. These embodiments are described in sufficient detail to enable those skilled in the art to practice the embodiments, and it is to be understood that other embodiments may be utilized and that logical, mechanical and electrical changes may be made without departing from the scope of the present disclosure. The following detailed description is, therefore, not to be taken in a limiting sense.

Embodiments of the present disclosure utilize heat dissipated by an electronic device to operate passive thermal management for the device. In order to maintain a proper operating environment for the electric device, at least some portion of heat generated by the device needs to be dissipated out to the external environment to keep the device from overheating. However, in many applications, the temperature of the electric device also needs to be maintained at a constant, or at least within a very narrow temperature range. Accordingly, the amount of heat flow that is permitted to flow from the device to the external environment will need to be regulated by the passive thermal management in order to keep the device at the target constant temperature and/or range. The passive regulation of heat flow will also vary as a function of the ambient temperature of the external environment and the difference in temperature between the electronic device and the external environment.

Presented herein are passive thermal management systems and methods for regulating the amount of heat that flows to the external environment so that the devices temperature can be maintained at a constant temperature. It should be understood that as the term will be used herein, "constant temperature" does not refer to a precise temperature value, but instead refers to a predefined temperature range selected by the system design engineer that defines the acceptable operating temperature range associated with the particular electronic device being temperature regulated. As illustrated by the example embodiments presented herein, thermal power dissipated by the electronic device being temperature regulated is harvested for self-heating of the device to a desired temperature adding little (or even zero) to the total power consumption of the system. Additionally, these example embodiments provide for a fully passive, yet variable, heat path conductively coupling the electronic device to the environment. The embodiments presented herein automatically regulate the operating temperature of the electronic device at any target constant temperature above the environmental ambient, using no extra power other than what is naturally dissipated by the electronic device during its normal operation. These embodiments in turn enable power efficient temperature stabilization of systems comprising heat generating elements such as, but not limited to, crystal oscillators, laser sources, or chemical compounds for atomic vapor stabilization, over wide operating temperature ranges. These embodiments may this be utilized to enable further development of new classes of fieldable atomic and optical sensors, accelerometers, gyroscopes, and atomic clocks based on MEMS technology, among other uses. It should be appreciated that because the embodiments presented herein regulate passive heat flow from a self-heating electronic device to an external environment, these embodiments allow regulation of that device at temperatures at or above the ambient temperature of the external environment.

FIGS. 1 and 1A are diagrams illustrating an example passive thermal management system 100 of one embodiment of the present disclosure that passively provides automatic thermal regulation. Passive thermal management system 100 performs this function by thermally expanding and contracting a cooling fluid held within one or more capillaries that define a path between a thermally isolated device structure at one end, and a heat sink (for example, the external environment) at the other end. Thermal expansion and contraction of the cooling fluid, which is achieved as a function of the cooling fluid's coefficient of thermal expansion, results in a flow of the cooling fluid further into the capillaries (in the case of thermal expansion due to heating of the fluid) or a flow of the cooling fluid out from the capillaries (in the case of thermal contraction due to cooling of the fluid). It should be understood that as the term is used herein, a "cooling fluid" is a fluid that cools by transferring heat by thermal conduction, as opposed to a refrigerant that provides cooling by undergoing phase transition cycles.

In the example embodiment of FIGS. 1 and 1A, passive thermal management system 100 comprises a self-heating electronic device 110 that is thermally conductively coupled to (for example, by being physically in contact with) a thermal interface 112. Thermal interface 112 is, in turn, thermally coupled to a cooling fluid 120 contained within a fluid reservoir 114. The thermal interface 112 may comprise a metal (such as copper, for example) a crystalline Silicon (c-Si) or other material having a high thermal conductivity that establishes a heat flow path between the device 110 and the cooling fluid 120. In some embodiments, the fluid reservoir 114 may be a sealed reservoir. However, in other embodiments, the fluid reservoir 114 may not necessarily be sealed, but may include one or more vents or other apertures (shown at 113) in fluid communication with the fluid reservoir 114. It should be appreciated that while device 110 may be a MEMS device, the embodiments described herein encompass implementations where device 110 both may comprises a MEMS device, or may comprises another device technology. In some embodiments, at least one surface of the fluid reservoir comprises the thermal interface.

Passive thermal management system 100 further comprises at least one capillary or channel 130 that is in non-recirculating fluid communication with the fluid reservoir 114 such that when the cooling fluid 120 expands from the fluid reservoir 114 into the channel 130, a column of cooling fluid 120 forms in the channel 130. For embodiments comprising a plurality channels, the cooling fluid 120 expands from the fluid reservoir 114 into each of the plurality of channels 130, forming a column of cooling fluid 120 in each of the respective channels 130.

The path of the channel 130 in which the cooling fluid 120 may flow, extends from the fluid reservoir 114 towards at a thermally conductive heat sink interface 140. The heat sink interface 140 may be used to seal the distal end of the channel 130 where the channel terminates. Once the cooling fluid 120 has absorbed sufficient heat from the device 110 such that it has fully expanded into the complete length of channel 130, the heat path from the device 110 to the heat sink interface 140 is completed and the heat sink interface 140 will absorb the thermal energy provided by the completed heat path. At least one surface of the heat sink interface 140 is exposed to the external environment 150 so that as the heat sink interface 140 absorbs heat transported to it by the cooling fluid 120, it may dissipate that heat (either by thermal conduction, convection or radiation) to the external environment 150.

In one embodiment, the heat sink interface 140 may comprise a metal (such as copper, for example) a crystalline Silicon (c-Si) or other material having a high thermal conductivity that establishes a heat flow path between the cooling fluid 120 and the external environment 150. In one embodiment, the fluid reservoir 114 and channel(s) 130 are fabricated such that they are thermally isolated within a thermally insulating material 116. In some embodiments, thermally insulating material 116 may comprise a material such as (but not limited to) porosified silicon, and the fluid reservoir 114 and channel(s) 130 may be fabricated as features formed within the thermally insulating material 116. As should be appreciated, by porosifying crystalline Silicon (c-Si) material with an electro-chemical process, the thermal conductivity of the processed regions of the material may be reduced by over 1000×. Moreover, porosified silicon material may be obtained by using known processes by which the thermal conductivity of a silicon substrate can be adjusted using standard lithographic and processing techniques. The resulting material may be patterned into regions having different thermal conductivity coefficients by varying the degree of porosification in different areas of the structure. Alternatively, thermally insulating material 116 may comprise other materials having intrinsically low thermal conductivity such as, but not limited to, glass or Polyimide (PI) materials.

The channel(s) 130 may be implemented as a pathway for the cooling fluid 120 cut, etched, or otherwise formed within the thermally insulating material 116. In the same way, fluid reservoir 114 may comprise a volume for holding the cooling fluid 120 that is cut, etched, or otherwise formed within the thermally insulating material 116. In some embodiments, the passive thermal management system 100 may be formed by depositing c-Si layers on a wafer or substrate. Those portions which are to comprise fluid reservoir 114 and at least one channel 130 are cut or etched from the deposited c-Si. Deposited layers of c-Si that are to become thermally insulating material 116 are processed into porosified silicon while those that are to comprise thermal interface 112 and or heat sink interface 140 are left as un-porosified c-Si. In some embodiments, thermal interface 112 and/or heat sink interface 140 are deposited into place as metallization layers. In some embodiments, the device 110 which the passive thermal management system 100 operates to temperature stabilize may be bonded or otherwise affixed to the thermal interface 112. In other embodiments, the device 110 itself may be fabricated on the thermal interface 110 in one or more layers using deposition techniques that those skilled in the art who have studied this disclosure would be able to implement.

Selection of the particular cooling fluid 120 for use in a particular application would be within the skill of those skilled in the art who have studied this disclosure, based on criteria such as the fluid's thermal conductivity, coefficient of thermal expansion, and boiling and freezing temperature. As an example, in some embodiments, the cooling fluid 120 may comprise a liquid metal such as, but not limited to, mercury or Galinstan. In other embodiments, cooling fluid 120 may comprise alcohol, glycerol, or other thermally conductive liquid. Cooling fluid 120 may be selected from available cooling fluids on the basis of which will remain in fluid form and/or will not boil or freeze within the range of expected temperatures to which it will be exposed. A cooling fluid 120 comprising mercury will have the advantage of forming a convex meniscus when used in combination with silicon, meaning that the thermally conductive cooling fluid 120 in the channel(s) 130 and fluid reservoir 114 will remain in unbroken continuity and deter formation of voids within the channel(s) 130 except where it has thermally contracted within the channel 130 from contact with the heat sink interface 140).

During normal operation, because the cooling fluid 120 in the fluid reservoir 114 is in intimate thermal contact with the device 110, it will reach a thermal equilibrium with that device 110. Thermal expansion will cause a column of the cooling fluid 120 to extend from the reservoir 114 into the channel(s) 130. This column of cooling fluid 120 will continue to expand into the channel(s) 130 until it comes into contract with the heat sink interface 140 at which point the thermally conductive heat path is established between the device 110 and the external environment 150. The length of cooling fluid 120 in the channel(s) 130 represents an excess volume of the cooling fluid 120 from the fluid reservoir 114 resulting from the cooling fluid 120 in the fluid reservoir 114 expanding due to thermal expansion.

The fluid reservoir 114 and channel(s) 130 are contained within a thermally insulating material 116 such that a conductive thermal path (which may be referred to as a conductive thermal link) between the device 110 and the external environment 150 is established via the cooling fluid 120 when the cooling fluid 120 fully extends into the channel 130 and comes contact the heat sink interface 140, as illustrated generally at 142 in FIG. 1. Thermally insulating material 116 essentially thermally isolates the fluid reservoir 114 and channel(s) 130 from parasitic heat paths to a sufficient degree that the column cooling fluid 120, once it sufficiently expands within the channel(s) 130 to come into contact with the heat sink interface 140, becomes the primary heat path between the device 110 and the external environment 150. That is, the conductive thermal path through the column of cooling fluid 120 is the primary heat path between the device 110 and the external environment 150, having greater thermal conductivity than any alternate parasitic path. It should be understood that passive thermal management system 100 becomes more efficient the more that this conductive thermal path via cooling fluid 120 becomes dominant over any parasitic paths. The electronic device 110 may thus be considered substantially thermally isolated from conductive paths to the heat sink interface 140 and/or the external environment 150, except for the conductive path via the cooling fluid 140.

During operation, when a sufficient amount of the thermal energy absorbed by the cooling fluid 140 begins to flow into the heat sink interface 140, the temperature of the cooling fluid 140 will decrease accordingly. As the cooling fluid 120 cools, it may contract back into the channel 130 and physically decouple from the heat sink interface 140, thus interrupting the conductive thermal path between the device 110 and the external environment 150, as illustrated in FIG. 1A general at 144. With the conductive heat path interrupted, the temperature of the cooling fluid 140 will again begin to rise, and thermal expansion of the cooling fluid 140 will again cause the fluid to physically recouple to the heat sink interface 140 thus reestablishing the conductive thermal path between the device 110 and the external environment 150. This form of "bang-bang" control is illustrated in FIG. 1B which shows heat conduction from the device 110 to the environment 150 occurring at times 160 when the column of fluid 120 has fully extended into the channel 130 due to thermal expansion, and a time average heat conduction level (shown at 162) achieved by the cycling of the column of fluid 120 between partially contracted and fully extended. The outcoupled power varies between a low and high value by the fluid 120 column expanding and contracting within channel 150, physically contacting, and then not contacting, the heat sink interface 140 which dissipates any heat it receives from the cooling fluid 120 to the environment 150. The duty cycle of heat path switching between on and off will self-regulate the control of the heat flow to the environment 150, and may eventually resulting in the system converging to an equilibrium state that stabilizes the temperature of the device 110.

If the vast majority of the volume of cooling fluid 120 is in thermal equilibrium with the device 110 that is to be stabilized, the extension of the column of cooling fluid 120 into contact with the heat sink interface 140 will reach a value that, either in a true continuous-wave (CW) or in a time averaged sense, moderates the conductive thermal link to the environment to maintain the desired temperature at device 110. No active monitoring and steering of any element is required for system 100 to achieve thermal management; it is entirely passive.

In cases where the ambient temperature of the external environment 150 is relatively hot such that the overall difference in temperature between device 110 and the environment 150 is small, then even when the conductive thermal path is active (i.e. the column of fluid 120 is fully extended and in contact with the heat sink interface 140), the flow of heat may only be moderate so that the conductive thermal pass remains active for relatively longer periods of time. Conversely, where the ambient temperature of the external environment 150 is relatively cool such that the overall difference in temperature between device 110 and the environment 150 is significant, the conductive thermal pass will remain coupled to the external environment 150 for shorter periods of time. Thermal regulation is thus achieved because the column of cooling fluid 120 will expand to occasionally dump heat into the environment so that in a time average sense the temperature at the device 100 is maintained at the desired temperature. As such, using just the energy dissipated from the device 110, a variable thermal path may be controlled to establish thermal self-regulation without the need to employ sensors or active electronics. The passive thermal management system 100 may be engineered to maintain the desired temperature at device 110 based on the selection of the length and diameter of the fluid carrying channel(s) 130, the thermal expansion and conduction properties of the cooling fluid 120, and area of interface between the heat sink interface 140 and the cooling fluid 120.

Figure 2:
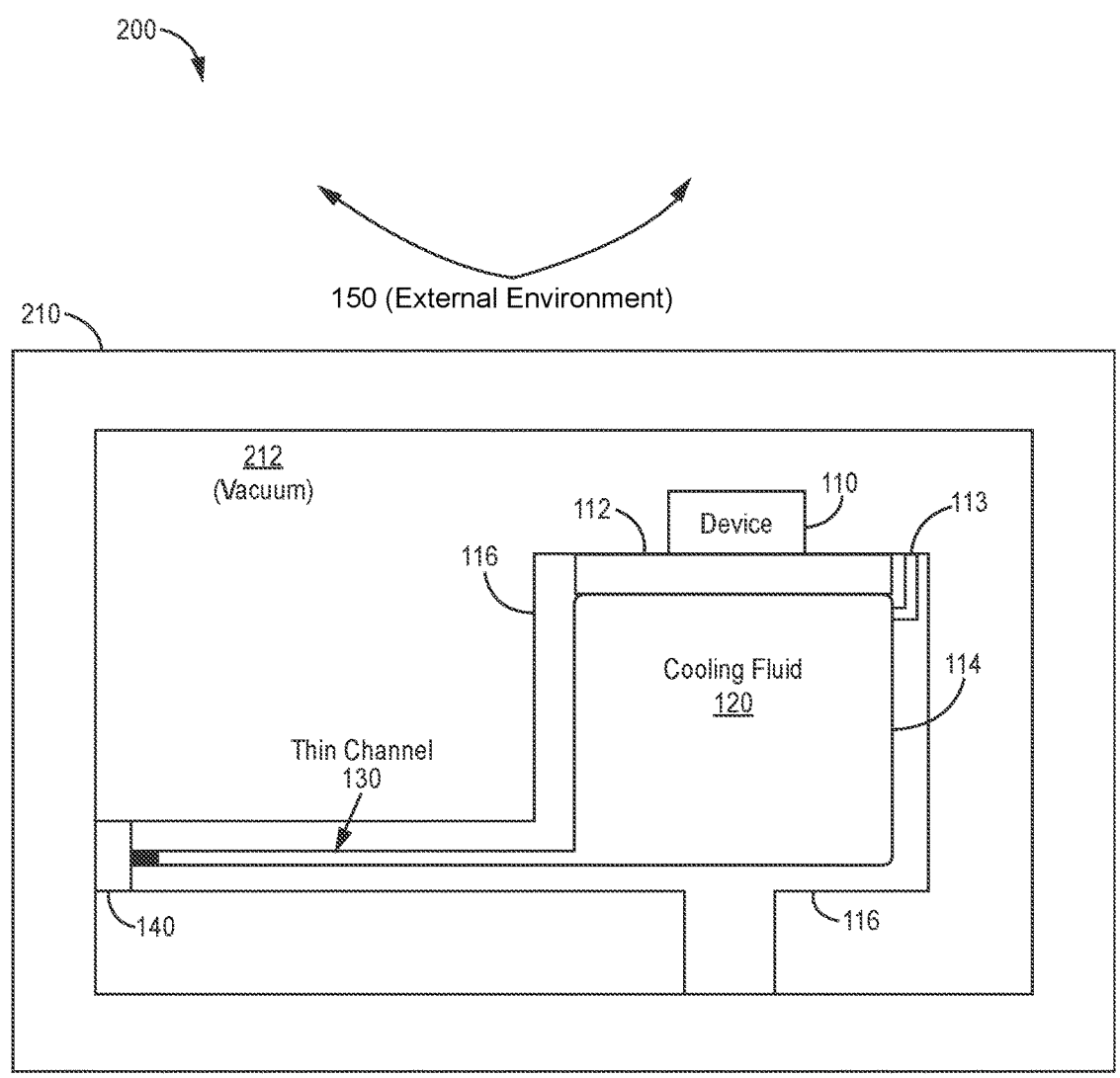
FIG. 2 illustrates another example passive thermal management system of one embodiment of the present disclosure.

FIG. 2 is a diagram illustrating a device 200 comprising an alternate implementation of passive thermal management system 100 used in conjunction with a device 110 that is embedded within an enclosure or housing 210. Here the heat sink interface 140 is physically coupled to the housing 210 (or may be integrated with the housing 210) so that the cooling fluid 120 when fully extended into channel 130 will establish a conductive thermal path between the device 110 and the housing 210. In this example implementation of passive thermal management system 100, the electronic device 110 may be the only appreciable source of heat within the housing 210, and the interior volume 212 of the housing is maintained at a vacuum. The temperature of the housing 210 may also be at an equilibrium with the temperature of the external environment 150. The volume of fluid in the reservoir 114 is much greater than the volume of fluid in the channel 130. For example, where the volume of the reservoir 114 may be on the order of 10's to 100's of cubic millimeters, a channel 130 may only be a few millimeters long (for example 2-5 mm) and on the order of 100 micron in diameter.

As mentioned above, the length of cooling fluid 120 in the channel(s) 130 is the excess volume of cooling fluid 120 that flows from the fluid reservoir 114 when the cooling fluid 120 in the fluid reservoir 114 has begun to expand due to thermal expansion. The length of the column of cooling fluid 120 will also be proportional to the amount of heat absorbed by the cooling fluid 120 from the device 110. The cooling fluid 120 in the fluid reservoir 114 will expand when heated by device 110 due to its positive coefficient of expansion, and cannot break out of the fluid reservoir 114. The cooling fluid 120 therefore expands into the channel(s) 130. Moreover, because of the effective thermal isolation discussed above, the length of cooling fluid 120 in the channel(s) 130 will continue to grow unit the cooling fluid 120 makes contact with the heat sink interface 140. The heat absorbed into the cooling fluid 120 will then flow to the external environment 150 until such point of time that it has released enough heat to contract in length and break its contact with the heat sink interface 140. The rate at which heat flows through this path is a function of the difference between the ambient temperatures conditions for the external environment 150, and because of the passive nature of this system, this difference will dictate the capacity of external environment 150 to absorb heat delivered to the heat sink interface 140 by the cooling fluid 120. The temperature of the device 110 will similarly influence the rate at which the cooling fluid 120 absorbs heat that needs to be transferred to the heat sink interface 140. The cyclical periodicity of the cooling fluid 120 coupling and decoupling from the heat sink interface 140 within a particular channel 130 will thus also be function of said difference. As such, in steady state device operation, the length of the column of cooling fluid 120 in a channel 130 will be a function of the temperature of the device 110. Because the temperature of device 110 is being regulated by system 100 to maintain a constant value, the length of the cooling fluid 120 in the channel 130 can be expected to have a mean length over time that corresponds to the device 130 temperature, with real time fluctuations in length occurring as a function of dynamic variations in the temperature of the external environment 150. But in a time averaged sense, the time averaged length of the column of cooling fluid 120 will be a function of (and proportional to) the temperature of device 110.

Figure 3:
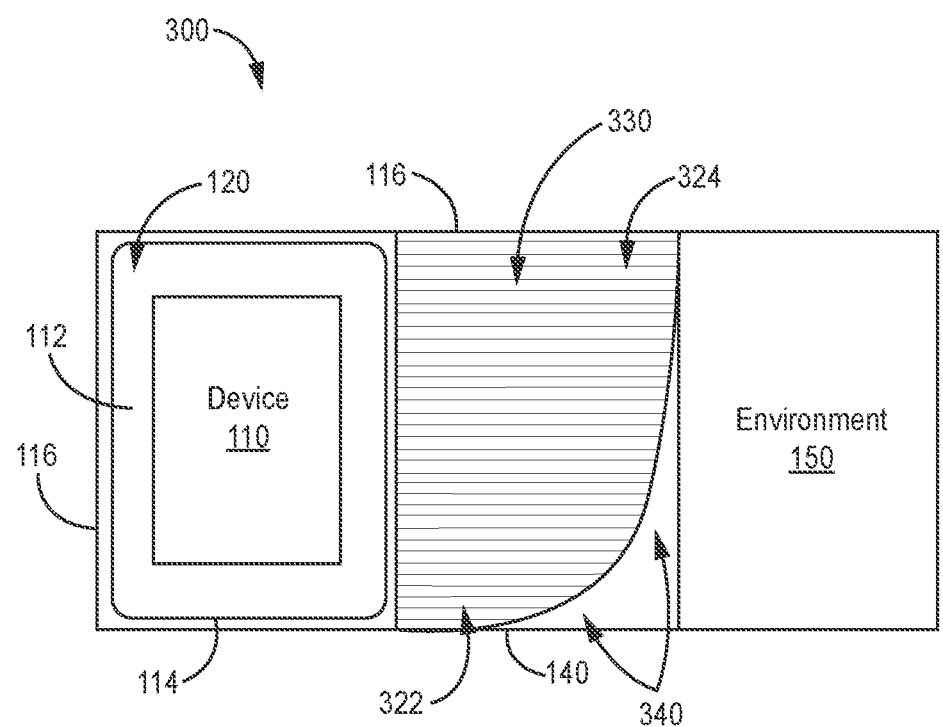
FIG. 3 illustrates another example passive thermal management system of one embodiment of the present disclosure.

FIG. 3 is a diagram of a passive thermal management system 300 comprising an example of an alternate implementation of the passive thermal management system 100 described above. It should be understood that the features and elements described herein with respect to FIG. 1 may be used in conjunction with, in combination with, or substituted for elements of FIG. 3, as well as any of the other embodiments discussed herein, and vice versa. Further, it should be understood that the functions, structures and other description of elements for embodiments described herein may apply to like named or described elements for any of the Figures and vice versa.

As shown in FIG. 3, in some embodiments, the passive thermal management system may comprise a plurality of channels 130 (which are shown in FIG. 3 as channels 330) that are non-uniform in length so that at a given temperature of device 110 (and therefore a corresponding given temperature of cooling fluid 120), some channels 330 may include a column of cooling fluid 120 that are in contact with the heat sink interface 140, while others do not. As such, the regulation of heat flow to the environment 150 varies over time as a function of the number of channels 130 having cooling fluid 120 in contact with the heat sink interface 140 rather than the length of time that the cooling fluid 120 is in contact with the heat sink interface 140. The greater the number of channels 130 having cooling fluid 120 in contact with the heat sink, the greater capacity the system has to deliver heat from device 110 to the environment 150.

As shown in FIG. 3, the profile of the heat sink interface 140 that interfaces with plurality of channels 130 may be curved or otherwise tailored (as shown at 340) so that contact between expanding cooling fluid 120 and the heat sink occurs at different lengths with contact in shorter channels (shown at 322) occurring sooner (i.e. at lower cooling fluid 120 temperatures) than for longer channels (shown at 324). The cooling fluid in 120 in the longer channels will have to expand a greater distance before coming into contact with the heat sink interface 140 as compared to the shorter channels. The embodiment in FIG. 3 thus provides a more continuous way to adjust the amount of heat that flows between the device 110 and the external environment 150 than an embodiment having only a single channel 130, or than an embodiment where multiple channels 130 have uniform dimensions.

In passive thermal management system 300 in operation, as the cooling fluid 120 absorbs heat form device 110, the cooling fluid 120 will expand the same amount in all of the channels 130, the fluid in the shorter channels 422 will reach the heat sink interface 140 and begin to transfer heat to the external environment 150 before the fluid in the longer channels 424. The greater number of channels 130 in which the cooling fluid 120 reaches their respective point of contact with the heat sink interface 140 will effectively increase the width of the heat path through which heat absorbed from device 110 can be transferred to the environment 150. Thus in steady state operation, it can be expected that some channels 130 (i.e. the shorter channels at 422) will remain filled with cooling fluid 120 to provide a constant heat path while other channels 130 (i.e., the longer channels at 424) will cycle in order to regulate the amount of heat transfer occurring from device 110 to the environment 150. The outcoupled power varies between low and high values by varying the number of channels 130 providing a thermal path to the environment 150 at any given time. This provides one means by which the system 300 maintains the desired device 110 temperature even as the environment 150 temperature changes. The particular lengths for each of the plurality of channels 130 may be engineered and tailored to provide desired amount of surface area interface with the heat sink interface 140 and a desired temperature transfer profile for given contemplated thermal conditions.

Figure 4:
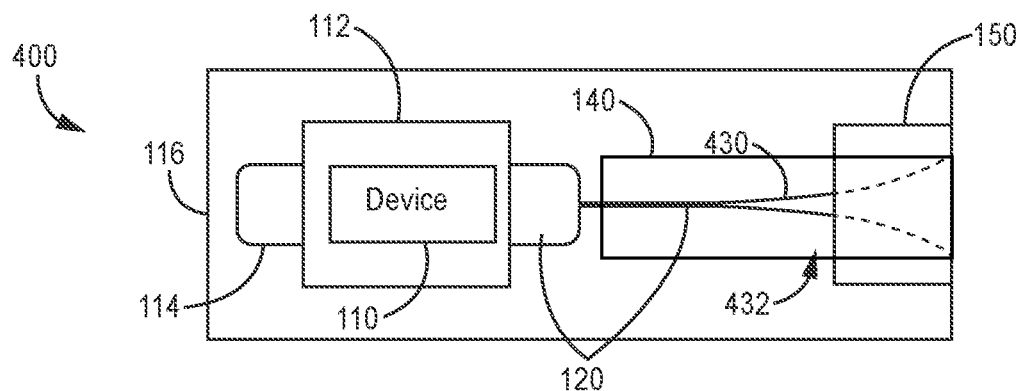
FIGS. 4 and 4A illustrate another example passive thermal management system of one embodiment of the present disclosure.
Figure 4A:
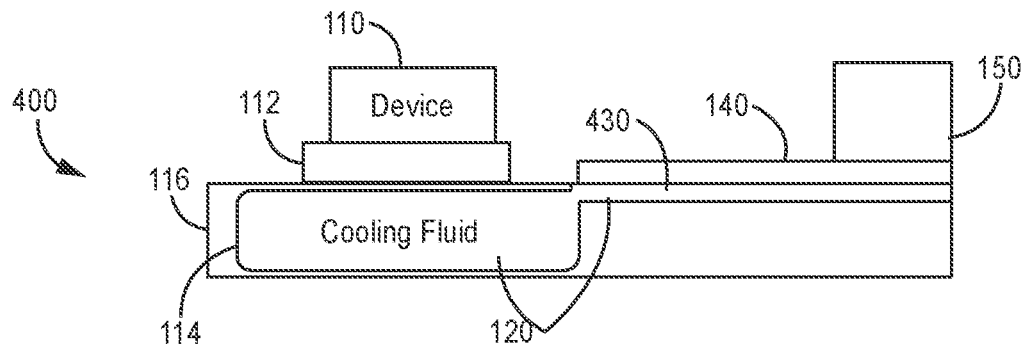

FIGS. 4 and 4A provide illustrations of yet another example embodiment of a system 500 where the outcoupled power varies between low and high values by varying the area of the conduction by the cooling fluid 120 extending or retracting in a channel 130 having a variable or non-linear width. This provides another means for a system to maintain the desired device 110 temperature even as the environment 150 temperature changes. It should be understood that the features and elements described herein with respect to FIGS. 4 and 4A may be used in conjunction with, in combination with, or substituted for elements of FIGS. 1 and 3, as well as any of the other embodiments discussed herein, and vice versa. Further, it should be understood that the functions, structures and other description of elements for embodiments described herein may apply to like named or described elements for any of the Figures and vice versa.

In particular, FIG. 4 illustrates a view of an example embodiment of a passive thermal management system 400 comprising at least one channel 130 (shown at 430) formed within the thermally insulating material 116 to couple the fluid reservoir 114 to the heat sink interface 140. In this example embodiment, the channel 430 is shaped to provide for a variation in the area of thermal contact between the cooling fluid 120 and the heat sink interface 140 as a function of fluid expansion length within the channel 430. That is, upon the cooling fluid 120 initially reaching the heat sink interface 140, the more that the cooling fluid 120 expands into the channel 430, the more of the heat sink interface 140 it will become in contact with.

In some embodiments, the channel 430 may be patterned with a non-uniform width that increases with the length of the channel 430. For example, FIG. 4 shows the channel 430 having a trumpet pattern at 423. In other embodiments, channel 430 may be patterned to maintain a uniform width for the length of the channel 430. In either case, once the cooling fluid 120 expands sufficiently to reach the heat sink interface 140, the channel 430 and the heat sink interface 140 are oriented so that the surface area of interface between the cooling fluid 120 and the heat sink interface 140 (and therefore external environment 150) continuously increases the more that the cooling fluid 120 further expands. As a result, as the cooling fluid 120 expands and contracts, the capacity of the heat path to transfer heat from device 110 to the external environment 150 correspondingly increases or decreases. The particular shape of the channel 430 may be engineered and tailored to provide the desired amount of surface area interface with the heat sink interface 140 and a desired temperature transfer profile for given contemplated thermal conditions.

Figure 5:
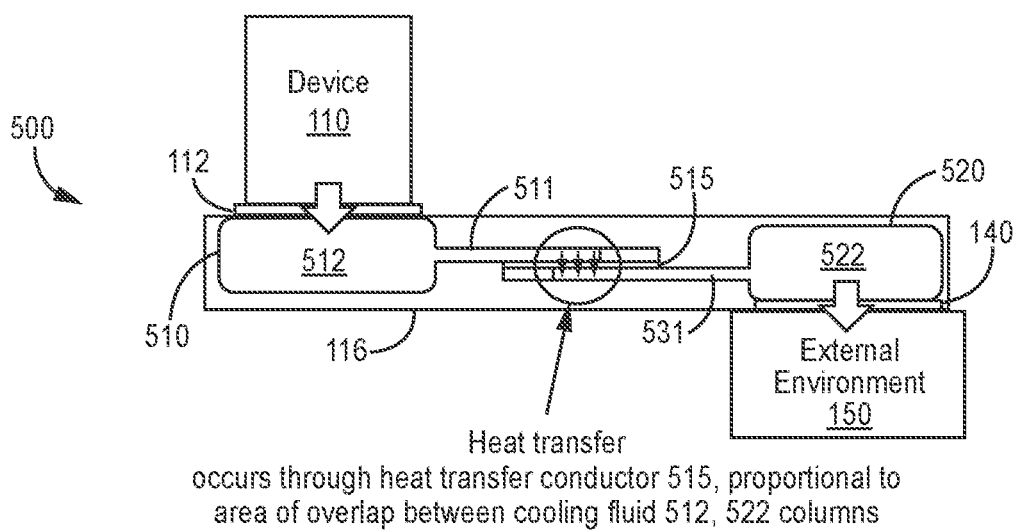
FIG. 5 illustrates another example passive thermal management system of one embodiment of the present disclosure.

FIG. 5 provides an illustration of yet another example embodiment of a system 500 where a passive thermal management system 500 comprises a set of complementary fluid reservoirs and channels. It should be understood that the features and elements described herein with respect to FIG. 5 may be used in conjunction with, in combination with, or substituted for elements of FIGS. 1-4A, as well as any of the other embodiments discussed herein, and vice versa. Further, it should be understood that the functions, structures and other description of elements for embodiments described herein may apply to like named or described elements for any of the Figures and vice versa.

In this embodiment a first fluid reservoir 510 comprises a first cooling fluid 512 in thermal contact with the device 110 (via thermal interface 112). Cooling fluid 512 expands into at least one channel 511 when heated in the same manner as described above in any of the previous disclosed embodiments. A difference introduced in passive thermal management system 500 is that as opposed to the cooling fluid 512 directly forming a heat path to the heat sink interface 140, the cooling fluid 512 conductively transfers heat to a second cooling fluid 522 that expands from a second fluid reservoir 520 that is in thermal communication with the external environment 150 via heat sink interface 140.

More specifically, in the particular embodiment shown in FIG. 500, the first cooling fluid 512 expands from first fluid reservoir 510 through channel(s) 511. The distal end of channel(s) 511 are coupled to a heat transfer conductor 515 (which may comprise any of the material described above with respect to heat sink interface 140), which is in turn coupled to the distal end of one or more channels 531 extending from the second fluid reservoir 520. The channel (s) 511 and the heat transfer conductor 515 may be oriented so that the area where heat transfer occurs between the cooling fluid 512 and the heat transfer conductor 515 continuously increases the more that the cooling fluid 512 further expands into the channel(s) 511, and decreases the more that the cooling fluid 512 contracts.

The second cooling fluid 522 expands from the second fluid reservoir 520 through the channel(s) 531 as a function of the thermal expansion coefficient of the second cooling fluid 522, in the same manner as described in any of the above embodiments. The second fluid reservoir 520 includes or is otherwise in contact with the heat sink interface 140, which functions to thermally couple the second cooling fluid 522 to the external environment 150. The channel 531 and the heat transfer conductor 515 are also oriented so that the area where heat transfer occurs between the cooling fluid 522 and the heat transfer conductor 515 continuously increases the more that the cooling fluid 522 further expands into the channel(s) 531, and decreases the more that the cooling fluid 522 contracts.

In contrast with the other embodiments described above, in this example embodiment, the conductive heat path between the device 110 and the external environment 150 becomes established when both the cooling fluid 512 and the cooling fluid 522 have sufficiently expanded within their respective channels 511 and 531 to reach the heat transfer conductor 515. As discussed above, the conductive thermal path is the primary heat path between the device 110 and the external environment 150, having greater thermal conductivity than any alternate parasitic path. It should be understood that passive thermal management system 500 becomes more efficient the more that this conductive thermal path via cooling fluids 512 and 522 becomes dominant over parasitic paths. As with the other embodiments discussed above, the electronic device 110 is substantially thermally isolated from all conductive paths to the heat sink interface 140 except for the conductive path via the cooling fluids 512 and 522.

A dual fluid system such as shown in FIG. 5 has the capacity to more directly react to two types of perturbations. For example, it is contemplated that such an arrangement may be used to accommodate applications where the device 110 is expected to fluctuate in the amount of heat it generates and dissipates when in operation. It may also better accommodate applications where the difference in temperature between the device 110 and the environment 150 is expected to rapidly change. Such an arrangement also increases the flexibility in design considerations. For example, in the embodiment of FIG. 500, the first and second cooling fluids 512 and 522 need not comprise the same fluid. For example, the fluid for the first cooling fluid 512 may be selected based on a first set of thermal expansion characteristic corresponding to the heat dissipation expected from the device 110. Meanwhile, the fluid for the second cooling fluid 522 may be selected based on a second, different, set of thermal expansion characteristic corresponding to the heat absorption characteristics expected from the external environment 150. The length of extension of the first cooling fluid 512 in channel 511 will correspond to the temperature of the device 110 while the length of extension of the second cooling fluid 522 in channel 531 will correspond to the temperature of the external environment. The length that each fluid must travel to reach the heat transfer conductor 515, and the overlap in surface area provided between the heat transfer conductor 515 and the cooling fluids 512, 522 may be engineered to determine how the system regulates the amount of heat transferred through the established thermal heat path.

Figure 6:
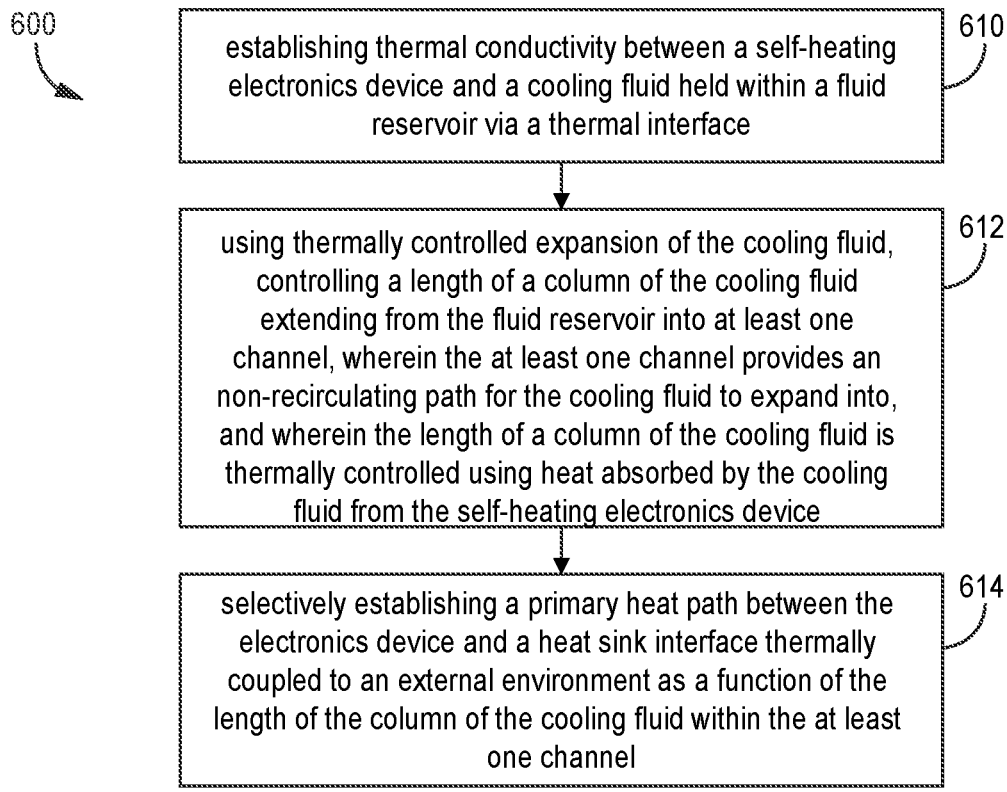
FIG. 6 is a flow chart illustrating a method for passive thermal management of one embodiment of the present disclosure.

FIG. 6 is a flow chart illustrating a method 600 for or passive thermal management of one embodiment of the present disclosure. It should be understood that the features and elements described herein with respect to method 600 may be used in conjunction with, in combination with, or substituted for elements of any of the other embodiments discussed herein, and vice versa. It should be understood that the functions, structures and other description of elements for embodiments described with respect to method may apply to like named or described elements associated with any of the figures herein and vice versa.

The method begins at 610 with establishing thermal conductivity between a self-heating electronic device and a cooling fluid held within a fluid reservoir via a thermal interface. In one embodiment, the self-heating electronic device is physically in contact with the thermal interface. The thermal interface is, in turn, thermally coupled to the cooling fluid contained within the fluid reservoir. The thermal interface may comprise a metal (such as copper, for example) a crystalline Silicon (c-Si) or other material having a high thermal conductivity that establishes a heat flow path between the electronic device and the cooling fluid. The fluid reservoir may be a sealed reservoir, but may not necessarily be sealed. It should be appreciated the self-heating electronic device may be a MEMS device or may comprise another device technology.

The method proceeds to 612 which includes using thermally controlled expansion of the cooling fluid to control a length of a column of the cooling fluid extending from the fluid reservoir into at least one channel, wherein the at least one channel provides a non-recirculating path for the cooling fluid to expand into, and wherein the length of a column of the cooling fluid is thermally controlled using heat absorbed by the cooling fluid from the self-heating electronic device. When heated, the cooling fluid expands from the fluid reservoir into the channel and a column of cooling fluid forms in the channel. For embodiments comprising a plurality channels, the cooling fluid expands from the fluid reservoir into each of the plurality of channels, forming a column of cooling fluid in each of the respective channels.

The method proceeds to 614 with selectively establishing a primary heat path between the electronic device and a heat sink interface thermally coupled to an external environment as a function of the length of the column of the cooling fluid within the at least one channel. The path of the channel in which the cooling fluid may flow, extends from the fluid reservoir towards a thermally conductive heat sink interface. In some embodiments, the heat sink interface may be used to seal distal end of the channel. Once the cooling fluid has absorbed sufficient heat from the electronic device such that it has expanded into the length of channel sufficiently to reach the heat sink interface, a heat path from the device to the heat sink interface is completed and the heat sink interface will absorb the thermal energy provided by the completed heat path. At least one surface of the heat sink interface is exposed to the external environment so that as the heat sink interface absorbs heat transported to it by the cooling fluid, it may dissipate that heat (either by thermal conduction, convection or radiation) to the external environment. In some embodiments, the electronic device may be located within a housing. In some embodiments, the electronic device may be housed within a vacuum within the housing. The heat sink interface may be coupled to the housing, or otherwise be an integrated part of the housing.

Other than the heat path established through the cooling fluid, the electronic device, as well as the fluid reservoir, channels, and thermal interface, are essentially thermally isolated from parasitic heat paths to the external environment. That is, the conductive thermal path through the column of cooling fluid is the primary heat path between the device and the external environment, having greater thermal conductivity than any alternate parasitic path. Accordingly, and as already described above, the channels may be implemented as a pathway for the cooling fluid that is cut, etched, or otherwise formed within thermally insulating material. In one embodiment, the fluid reservoir may comprise a volume for holding the cooling fluid that is cut, etched, or otherwise formed within the thermally insulating material. In some embodiments, the fluid reservoir, channel(s) and heat sink interfaces may be formed by depositing c-Si layers on a wafer or substrate. Those portions which are to comprise fluid reservoir and at least one channel 130 are cut or etched from the deposited c-Si. In some embodiments, the deposited layers of c-Si that are to become thermally insulating material may be processed into porosified silicon while those that are to comprise the thermal interface and/or heat sink interface 140 are left as un-porosified c-Si. In some embodiments, the thermal interface and/or heat sink interface are deposited into place as metallization layers. In some embodiments, the electronic device may be bonded or otherwise affixed to the thermal interface. In other embodiments, the electronic device itself may be fabricated on the thermal interface in one or more layers using deposition techniques that those skilled in the art who have studied this disclosure would be able to implement.

In some embodiments, the method 600 may include a plurality of channels 130 that are non-uniform in length so that at a given temperature of the electronic device 110 some channels may include a column of cooling fluid that is in contact with the heat sink interface, while others do not. As such, the regulation of heat flow to the external environment may vary over time as a function of the number of channels having cooling fluid in contact with the heat sink interface rather than the length of time that the cooling fluid is in contact with the heat sink interface. The greater the number of channels having cooling fluid in contact with the heat sink, the greater capacity the system has to deliver heat from device to the environment. In some embodiments, the profile of the heat sink interface that interfaces with plurality of channels may be curved or otherwise tailored so that contact between expanding cooling fluid and the heat sink occurs at different lengths with contact in shorter channels occurring sooner than for longer channels. The cooling fluid in the longer channels will have to expand a greater distance before coming into contact with the heat sink interface as compared to the shorter channels.

In some embodiments, the outcoupled power through the heat path varies between low and high values by varying the area of the conduction by the cooling fluid extending or retracting in a channel having a variable or non-linear width. That is, the channel may be shaped to provide for a variation in the area of thermal contact between the cooling fluid and the heat sink interface as a function of fluid expansion length within the channel. Upon the cooling fluid initially reaching the heat sink interface, the more that the cooling fluid expands into the channel, the more of the heat sink interface it will become in contact with.

In some embodiments, the fluid reservoir and cooling fluid of block 610 may comprise a first fluid reservoir and first cooling fluid, and the method may comprise using a second fluid reservoir and first cooling fluid, such as shown in FIG. 5 for example. In one such alternative embodiment, as opposed to the first cooling fluid directly forming a heat path to the heat sink interface, the first cooling fluid conductively transfers heat to the second cooling fluid that expands from the second fluid reservoir. The second fluid reservoir is in thermal communication with the external environment via heat sink interface. In some embodiments, the distal end of the first channel is coupled to a heat transfer conductor, which is in turn coupled to the distal end of a second channel extending from the second fluid reservoir. In some embodiments, the first and second channels and the heat transfer conductor may be oriented so that the area where heat transfer occurs between the cooling fluids and the heat transfer conductor continuously increases the more that the respective cooling fluids further expands into their respective channels.

In this embodiment, the conductive heat path between the electronic device and the external environment becomes established when both the cooling fluids have sufficiently expanded within their respective channels to reach the heat transfer conductor. This conductive heat path is the primary heat path between the device and the external environment, having greater thermal conductivity than any alternate parasitic path. An implementation of method 600 using dual fluids has the capacity to more directly react to two types of perturbations. For example, it is contemplated that such an arrangement may be used to accommodate applications where the electronic device is expected to fluctuate in the amount of heat it generates and dissipates when in operation. It may also better accommodate applications where the difference in temperature between the electronic device and the environment is expected to rapidly change. Such an arrangement also increases the flexibility in design considerations. It should be understood that the first and second cooling fluids need not comprise the same fluid material. For example, the fluid for the first cooling fluid may be selected based on a first set of thermal expansion characteristic corresponding to the heat dissipation expected from the device while the second cooling fluid may be selected based on a second and different, set of thermal expansion characteristic corresponding to the heat absorption characteristics expected from the external environment. The length that each fluid must travel to reach the heat transfer conductor as well as the overlap in surface area provided between the heat transfer conductor and the cooling fluids, may be engineered to determine how the method regulates the amount of heat transferred through the established thermal heat path.

EXAMPLE EMBODIMENTS

Example 1 includes a method for passive thermal management, the method comprising: establishing thermal conductivity between a self-heating electronic device and a cooling fluid held within a fluid reservoir via a thermal interface; using thermally controlled expansion of the cooling fluid, controlling a length of a column of the cooling fluid extending from the fluid reservoir into at least one channel extending from the fluid reservoir, wherein the at least one channel provides a non-recirculating path for the cooling fluid to expand into, and wherein the length of a column of the cooling fluid is thermally controlled using heat absorbed by the cooling fluid from the self-heating electronic device; selectively establishing a primary heat path between the electronic device and a heat sink interface thermally coupled to an external environment as a function of the length of the column of the cooling fluid within the at least one channel.

Example 2 includes the method of example 1, wherein at least one surface of the heat sink interface is exposed to the external environment.

Example 3 includes the method of any of examples 1-2, wherein the heat sink interface is integrated within a housing in which the electronic device is located.

Example 4 includes the method of any of examples 1-3, wherein the self-heating electronic device is physically in contact with the thermal interface.

Example 5 includes the method of any of examples 1-4, wherein the thermal interface may comprise a metal.

Example 6 includes the method of any of examples 1-5, wherein the heat sink interface seals the at least one channel.

Example 7 includes the method of any of examples 1-6, wherein the electronic device, the fluid reservoir, at least one channel, and the thermal interface, are essentially thermally isolated from parasitic heat paths to the external environment, other than through the primary heat path established through the cooling fluid.

Example 8 includes the method of any of examples 1-7, wherein the at least one channel comprises a plurality of channels that are non-uniform in length such that at a given temperature of the electronic device, at least a first of the plurality channels includes a column of cooling fluid in contact with the heat sink interface, while at least a second of the plurality channels includes a column of cooling fluid not in contact with the heat sink interface.

Example 9 includes the method of example 8, wherein a profile of the heat sink interface that interfaces with the plurality of channels is tailored in shape such that contact between expanding cooling fluid and the heat sink interface occurs at different lengths.

Example 10 includes the method of any of examples 1-9, wherein the at least one channel is shaped to vary in area of thermal contact between the cooling fluid and the heat sink interface as a function of fluid expansion length within the at least one channel.

Example 11 includes the method of any of examples 1-10, further comprising: establishing thermal conductivity between the heat sink interface and a second cooling fluid held within a second fluid reservoir; using thermally controlled expansion, controlling a length of a column of the second cooling fluid extending from the second fluid reservoir into at least a second channel, wherein the second channel provides a non-recirculating path for the second cooling fluid to expand into, and wherein the length of a second column of the second cooling fluid is thermally controlled using heat absorbed by the second cooling fluid from the heat sink interface, and wherein the a distal end of the second channel extending from the second fluid reservoir is coupled to a distal end of the at least one channel extending from the fluid reservoir by a heat transfer conductor; selectively establishing the primary heat path between the electronic device and a heat sink interface thermally coupled to an external environment as a function of the length of the column of the cooling fluid within the at least one channel and the length of a column of the second cooling fluid extending from the second fluid reservoir.

Example 12 includes a passive thermal management system, the system comprising: a thermal interface configured to couple to a self-heating electronic device; a heat sink interface thermally coupled to an external environment; a cooling fluid held within a fluid reservoir, wherein at least one surface of the fluid reservoir comprises the thermal interface, wherein the cooling fluid is conductively thermally coupled to the electronic device via the thermal interface and wherein the electronic device is substantially thermally isolated from conductive paths to the heat sink interface; at least one channel in non-recirculating fluid communication with the fluid reservoir, wherein the cooling fluid expands out from the fluid reservoir and into the at least one channel when heated by the electronic device for a length that is a function of a coefficient of thermal expansion of the cooling fluid; wherein a conductive heat path between the electronic device and the heat sink is established via the cooling fluid at least in part as a function of the length the cooling fluid has expanded into the at least one channel due to thermal expansion.

Example 13 includes the system of example 12, further comprising: a second cooling fluid contained within a second fluid reservoir, wherein the second cooling fluid is conductively thermally coupled to the external environment via the heat sink; at least a second channel that is in fluid communication with the second fluid reservoir, wherein the second cooling fluid expands into the second channel when heated by external environment a second length that is a function of a second coefficient of thermal expansion of the second cooling fluid; a heat transfer conductor having a first surface area interface with the first channel and a second surface area interface with the second channel; wherein a conductive heat path between the electronic device and the heat sink interface is established via the first cooling fluid and the second cooling fluid as a function of: 1) a first length the first cooling fluid has expanded into the first channel, and 2) a second length the second cooling fluid has expanded into second channel.

Example 14 includes the system of any of examples 12-13, wherein the at least one channel and the fluid reservoir are cut, etched, or formed, within thermally insulating material.

Example 15 includes the system of any of examples 12-14, wherein other than a primary heat path established through the cooling fluid, the electronic device, the fluid reservoir, at least one channel, and the thermal interface, are essentially thermally isolated from parasitic heat paths to the external environment by a thermally insulating material comprising porosified silicon.

Example 16 includes the system of any of examples 12-15, wherein the heat sink interface is integrated within a housing in which the electronic device is located.

Example 17 includes the system of any of examples 12-16, wherein at least one surface of the heat sink interface is exposed to the external environment.

Example 18 includes the system of any of examples 12-17, wherein the at least one channel comprises a plurality of channels that are non-uniform in length such that at a given temperature of the electronic device, at least a first of the plurality channels includes a column of cooling fluid in contact with the heat sink interface, while at least a second of the plurality channels includes a column of cooling fluid not in contact with the heat sink interface.

Example 19 includes the system of example 18, wherein a profile of the heat sink interface that interfaces with the plurality of channels is tailored in shape such that contact between expanding cooling fluid and the heat sink interface occurs at different lengths.

Example 20 includes the system of any of examples 12-19, wherein the at least one channel is shaped to vary in area of thermal contact between the cooling fluid and the heat sink interface as a function of fluid expansion length within the at least one channel.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that embodiments be limited only by the claims and the equivalents thereof.

What is claimed is:

1. A method for passive thermal management, the method comprising:
   establishing thermal conduction between a self-heating electronic device and a cooling fluid held within a fluid reservoir via a thermal interface;
   using thermally controlled expansion of the cooling fluid, controlling a length of a column of the cooling fluid extending from the fluid reservoir into at least one of a channel extending from the fluid reservoir, wherein the at least one of the channel provides a non-recirculating path for the cooling fluid to expand into, and wherein the length of the column of the cooling fluid is thermally controlled using heat absorbed by the cooling fluid from the self-heating electronic device; and
   selectively establishing a primary heat path between the self-heating electronic device and a heat sink interface thermally coupled to an external environment as a function of the length of the column of the cooling fluid within the at least one of the channel;
   wherein the at least one of the channel is shaped to vary in area of thermal contact between the cooling fluid and the heat sink interface as a function of fluid expansion length within the at least one of the channel.

2. The method of claim 1, wherein at least one surface of the heat sink interface is exposed to the external environment.

3. The method of claim 1, wherein the heat sink interface is integrated within a housing in which the self-heating electronic device is located.

4. The method of claim 1, wherein the self-heating electronic device is physically in contact with the thermal interface.

5. The method of claim 1, wherein the thermal interface comprises a metal.

6. The method of claim 1, wherein the heat sink interface seals the at least one of the channel.

7. The method of claim 1, wherein the self-heating electronic device, the fluid reservoir, at least one of the channel, and the thermal interface, are thermally isolated from parasitic heat paths to the external environment, other than through the primary heat path established through the cooling fluid.

8. The method of claim 1, wherein the at least one of the channel comprises a plurality of channels that are non-uniform in length such that at a given temperature of the self-heating electronic device, at least a first of the plurality of channels includes a first column of cooling fluid in contact with the heat sink interface, while at least a second of the plurality of channels includes a second column of cooling fluid not in contact with the heat sink interface.

9. The method of claim 8, wherein a profile of the heat sink interface that interfaces with the plurality of channels is tailored in shape such that as the cooling fluid expands, contact between the cooling fluid and the heat sink interface occurs at different lengths in different channels of the plurality of channels.

10. A method for passive thermal management, the method comprising:
    establishing a first thermal conduction between a self-heating electronic device and a first cooling fluid held within a first fluid reservoir via a thermal interface;
    using thermally controlled expansion of the first cooling fluid, controlling a length of a first column of the first cooling fluid extending from the first fluid reservoir into at least one of a channel extending from the first fluid reservoir, wherein the at least one of the channel provides a non-recirculating path for the first cooling fluid to expand into, and wherein the length of the first column of the first cooling fluid is thermally controlled using heat absorbed by the first cooling fluid from the self-heating electronic device;
    selectively establishing a primary heat path between the self-heating electronic device and a heat sink interface thermally coupled to an external environment as a function of the length of the first column of the first cooling fluid within the at least one of the channel;
    establishing a second thermal conduction between the heat sink interface and a second cooling fluid held within a second fluid reservoir;
    using thermally controlled expansion of the second cooling fluid, controlling a length of a second column of the second cooling fluid extending from the second fluid reservoir into at least a second channel, wherein the second channel provides a non-recirculating path for the second cooling fluid to expand into, and wherein the length of the second column of the second cooling fluid is thermally controlled using heat absorbed by the second cooling fluid from the heat sink interface, and wherein the a distal end of the second channel extending from the second fluid reservoir is coupled to a distal end of the at least one of the first channel extending from the first fluid reservoir by a heat transfer conductor; and
    selectively establishing the primary heat path between the self-heating electronic device and the heat sink interface thermally coupled to the external environment as a function of the length of the first column of the first cooling fluid within the at least one of the first channel and the length of the second column of the second cooling fluid extending from the second fluid reservoir.

11. A passive thermal management system, the system comprising:
    a thermal interface configured to couple to a self-heating electronic device;
    a heat sink interface thermally coupled to an external environment;
    a first cooling fluid held within a first fluid reservoir, wherein at least one surface of the first fluid reservoir comprises the thermal interface, wherein the first cooling fluid is conductively thermally coupled to the electronic self-heating device via the thermal interface and wherein the self-heating electronic device is substantially thermally isolated from conductive paths to the heat sink interface; and
    at least one first channel in non-recirculating fluid communication with the first fluid reservoir, wherein the first cooling fluid expands out from the first fluid reservoir and into the at least one first channel when heated by the self-heating electronic device for a first length that is a function of a coefficient of thermal expansion of the first cooling fluid;
    wherein a conductive heat path between the self-heating electronic device and the heat sink is established via the first cooling fluid at least in part as a function of the first length of the first cooling fluid has expanded into the at least one first channel due to the thermal expansion; and
    wherein the at least one first channel is shaped to vary in area of thermal contact between the first cooling fluid and the heat sink interface as a function of fluid expansion length within the at least one first channel.

12. The system of claim 11, further comprising:
    a second cooling fluid contained within a second fluid reservoir, wherein the second cooling fluid is conductively thermally coupled to the external environment via the heat sink;
    at least a second channel that is in fluid communication with the second fluid reservoir, wherein the second cooling fluid expands into the at least the second channel when heated by external environment a second length that is a function of a second coefficient of thermal expansion of the second cooling fluid; and
    a heat transfer conductor having a first surface area interface with the at least one first channel and a second surface area interface with the at least the second channel;
    wherein a conductive heat path between the self-heating electronic device and the heat sink interface is established via the first cooling fluid and the second cooling fluid as a function of: 1) the first length the first cooling fluid has expanded into the at least one first channel, and 2) the second length the second cooling fluid has expanded into the at least the second channel.

13. The system of claim 11, wherein the at least one first channel and the first fluid reservoir are cut, etched, or formed, within thermally insulating material.

14. The system of claim 11, wherein other than a primary heat path established through the cooling fluid, the self-heating electronic device, the fluid reservoir, at least one first channel, and the thermal interface, are thermally isolated from parasitic heat paths to the external environment by a thermally insulating material comprising porosified silicon.

15. The system of claim 11, wherein the heat sink interface is integrated within a housing in which the self-heating electronic device is located.

16. The system of claim 11, wherein at least one surface of the heat sink interface is exposed to the external environment.

17. The system of claim 11, wherein the at least one first channel comprises a plurality of first channels that are non-uniform in length such that at a given temperature of the self-heating electronic device, at least a first of the plurality of first channels includes a first column of the first cooling fluid in contact with the heat sink interface, while at least a second of the plurality of first channels includes a second column of the first cooling fluid not in contact with the heat sink interface.

18. The system of claim 17, wherein a profile of the heat sink interface that interfaces with the plurality of first channels is tailored in shape such that when the first cooling fluid expands, contact between the first cooling fluid and the heat sink interface occurs at different lengths in different channels of the plurality of first channels.

* * * * *